(12) United States Patent
Slama et al.

(10) Patent No.: US 9,465,683 B2
(45) Date of Patent: Oct. 11, 2016

(54) APPARATUS AND A METHOD FOR PROVIDING AN ERROR SIGNAL FOR A CONTROL UNIT

(71) Applicant: Infineon Technologies AG, Neubiberg (DE)

(72) Inventors: Peter Slama, Klagenfurt (AT); Friedrich Rasbornig, Klagenfurt (AT); Simon Hainz, Klagenfurt (AT); Kirk Herfurth, Müchen (DE)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 14/324,766

(22) Filed: Jul. 7, 2014

(65) Prior Publication Data

US 2016/0004585 A1    Jan. 7, 2016

(51) Int. Cl.
*H03M 13/00* (2006.01)
*G06F 11/07* (2006.01)

(52) U.S. Cl.
CPC ....... *G06F 11/0772* (2013.01); *G06F 11/0745* (2013.01)

(58) Field of Classification Search
CPC ........... G06F 11/0772; G06F 11/0745; B60T 17/18; B60T 17/22; B60T 8/171; B60T 8/172; B60T 2250/06; B60T 8/885; B60T 2270/416; G01M 17/013; G01P 21/02; G01P 3/489; G01P 3/00; G01P 21/00; A61B 5/14532; A61B 5/1486; G01N 27/3274; G01D 5/24452
See application file for complete search history.

(56) References Cited

U.S. PATENT DOCUMENTS

| | | | | |
|---|---|---|---|---|
| 5,379,635 A | * | 1/1995 | Gee | F02B 41/1495 123/688 |
| 5,459,732 A | * | 10/1995 | Wise | B60T 8/885 701/76 |
| 6,389,874 B1 | * | 5/2002 | Huff | F02D 41/222 73/1.02 |
| 7,194,377 B1 | * | 3/2007 | Saito | G01D 5/24452 702/142 |
| 8,736,684 B1 | * | 5/2014 | Johansson | H04N 17/002 348/180 |

FOREIGN PATENT DOCUMENTS

DE    196188767A1    2/1997

OTHER PUBLICATIONS

Infineon Technologies AG, Advanced Diff. Speed Sensor TLE4941plusC, Rev. 1.1 , Mar. 2010, 13 pages.
(Continued)

*Primary Examiner* — Guerrier Merant
(74) *Attorney, Agent, or Firm* — Schiff Hardin LLP

(57) ABSTRACT

An apparatus for providing an error signal for a control unit, the error signal indicating a malfunction of a sensor unit. The apparatus includes an input module configured to receive a sensor signal from the sensor unit, the sensor signal being a periodic signal between an upper level and a lower level of a physical quantity. Further, the apparatus includes a determination module configured to determine the malfunction of the sensor unit and an output module configured to provide the error signal indicating the malfunction for the control unit. The error signal comprises a predetermined level of the physical quantity which differs from the upper level and from the lower level.

20 Claims, 18 Drawing Sheets

(56) References Cited

U.S. PATENT DOCUMENTS

| | | | |
|---|---|---|---|
| 2004/0015282 A1* | 1/2004 | Babala | G01L 15/00 701/70 |
| 2004/0066183 A1 | 4/2004 | Lohberg | |
| 2009/0001965 A1* | 1/2009 | Ausserlechner | G01D 5/145 324/202 |
| 2011/0054733 A1* | 3/2011 | Kong | B60T 8/171 701/29.2 |
| 2011/0146369 A1* | 6/2011 | Babala | B60T 8/885 73/1.38 |
| 2012/0199496 A1* | 8/2012 | Sekimoto | A61B 5/14532 205/775 |
| 2013/0166184 A1* | 6/2013 | Wuerth | F02D 35/02 701/111 |
| 2013/0320970 A1* | 12/2013 | Foletto | G01D 5/2448 324/251 |

OTHER PUBLICATIONS

Infineon Technologies AG, Wheel Speed Sensor, iGMR based Wheel Speed Sensor, TLE5041plusC, V. 1.0, May 2013, 30 pages.

* cited by examiner

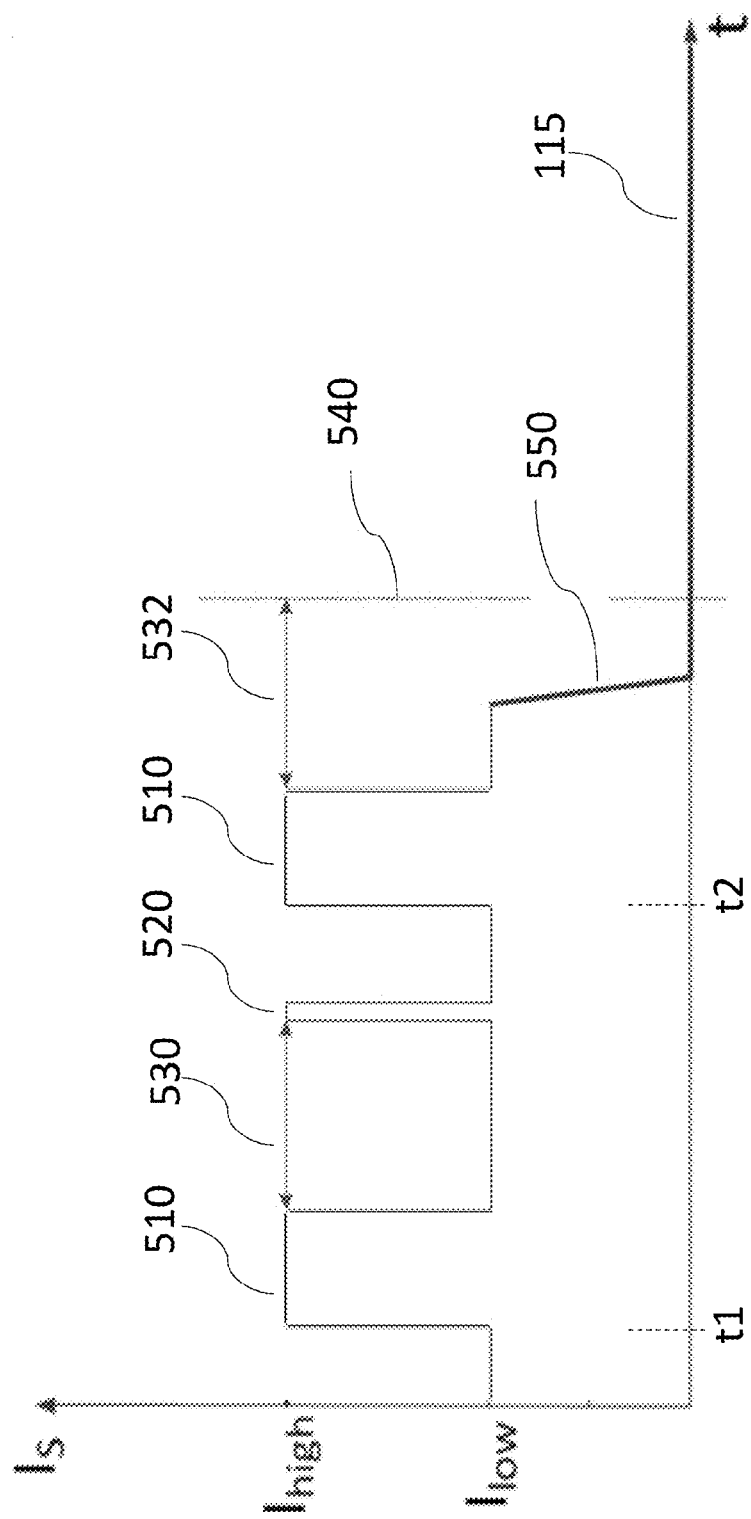

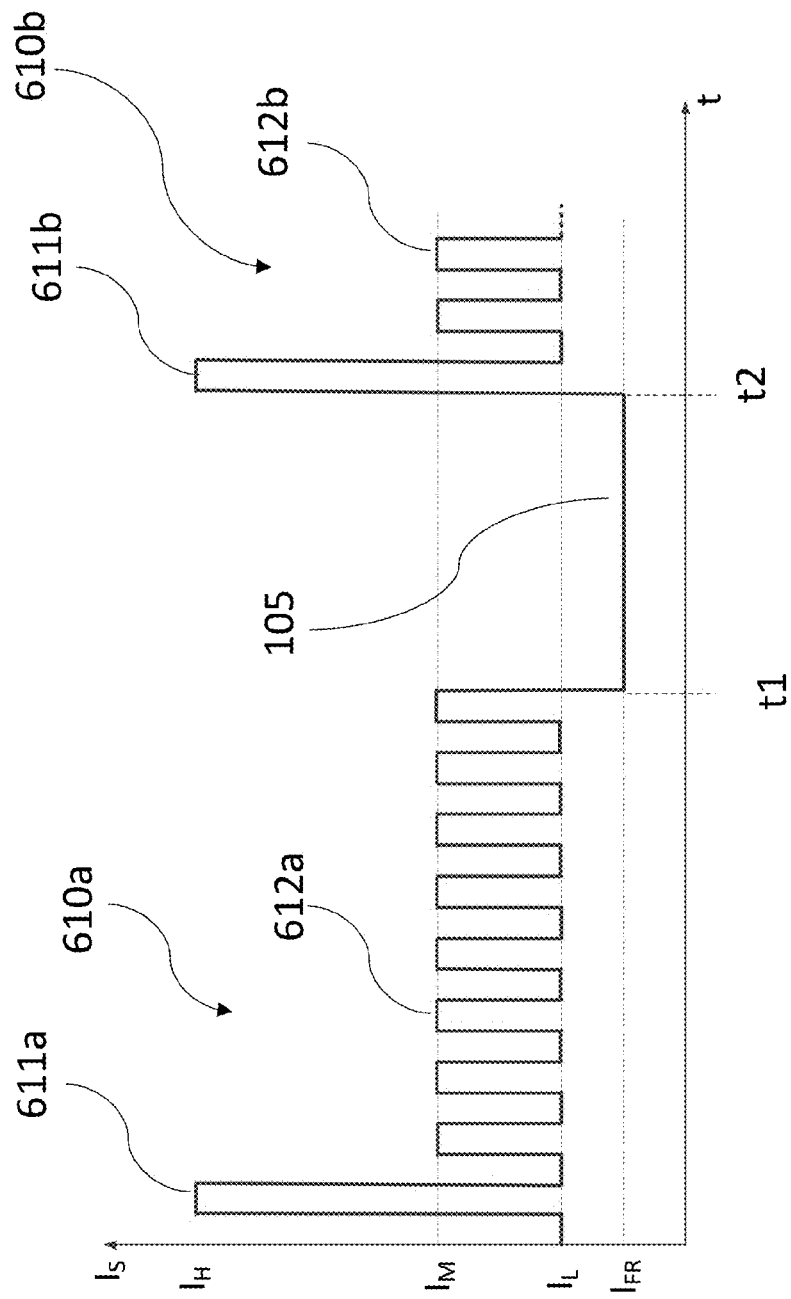

APPARATUS AND A METHOD FOR PROVIDING AN ERROR SIGNAL FOR A CONTROL UNIT

TECHNICAL FIELD

The present disclosure relates to an apparatus and a method for providing an error signal for a control unit and, in particular, to a failure indication to signalize chip internal failures.

BACKGROUND

In the field of wheel speed sensors designed for sophisticated vehicle control systems one important issue relates to a reliable control over internal functions of wheel speed sensors. In automotive industry wheel speed sensors are used for ABS (anti-lock braking systems), gearbox and transmission applications, but also for indirect tire pressure monitoring systems (relying on deviations in the rotational speed between two wheels). The requirements in the automotive industry have been increased in recent times and, in particular, the robustness with respect to electrostatic discharge and electromagnetic compatibility has been increased. This, in turn, implies an increased demand for a reliable error management enabling rotational speed sensors to indicate internal failures or malfunctions reliably and promptly to a control unit, as for example the electronic control unit (ECU) used in automotive applications.

SUMMARY

An apparatus according to one embodiment for providing an error signal for a control unit, the error signal indicating an internal malfunction of a sensor unit. The apparatus comprises an input module, which is configured to receive a sensor signal from the sensor unit, the sensor signal being a periodic signal. Further, the apparatus comprises a determination module, which is configured to determine the internal malfunction of the sensor unit or the apparatus, and an output module, which is configured to provide the error signal indicating the internal malfunction for the control unit. The error signal comprises a predetermined level of a physical quantity which differs from an upper level and from a lower level used for providing periodic information of the sensor signal.

According to a further embodiment a further apparatus for providing an error signal for a control unit, the error signal indicating a malfunction of a sensor unit. The apparatus comprises an input module, which is configured to receive a sensor signal from the sensor unit, the sensor signal being a periodic signal in a physical quantity. Further, the apparatus comprises an output module, which is configured to provide the error signal indicating the malfunction for the control unit. The error signal comprises the predetermined level of the physical quantity for at least a predetermined time period.

According to a further embodiment an apparatus comprises means for receiving a sensor signal from a sensor unit, the sensor signal being a periodic signal between an upper level and a lower level of a fluctuating signal in a physical quantity. Further, the apparatus comprises means for determining a malfunction of the sensor unit and means for providing an error signal for a control unit, the error signal indicating a malfunction of the sensor unit. The error signal comprises a predetermined level of the physical quantity for a predetermined time period, or the error signal differs from the upper level and from the lower level.

According to a further embodiment a method comprises receiving a sensor signal from a sensor unit, the sensor signal being a periodic signal between an upper level and a lower level of a physical quantity. Further, the method comprises determining the malfunction of the sensor unit and providing an error signal indicating the malfunction for a control unit. The error signal comprises a predetermined level of the physical quantity which differs from the upper level and from the lower level.

BRIEF DESCRIPTION OF THE FIGURES

Some examples of the apparatuses and/or methods will be described in the following by way of examples only, and with respect to the accompanying Figures, in which:

FIGS. 5a to 5d depict sensor signals including an alive signal with different malfunctions of the sensor unit;

FIGS. 6a to 6c depict sensor signals using an amplitude modulation protocol with an error signal according to a further embodiment of the present disclosure.

DETAILED DESCRIPTION

Various embodiments will now be described in more detail with reference to the accompanying drawings in which some embodiments are illustrated. In the figures, the thicknesses of lines, and/or regions may be exaggerated for clarity.

Accordingly, while examples are capable of various modifications and alternative forms, the illustrative examples in the figures will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, may be interpreted as having a meaning that is consistent with their meaning in the context of the relevant art and will not be interpreted in an idealized or overly formal sense unless expressly so defined herein.

Figure 1A:
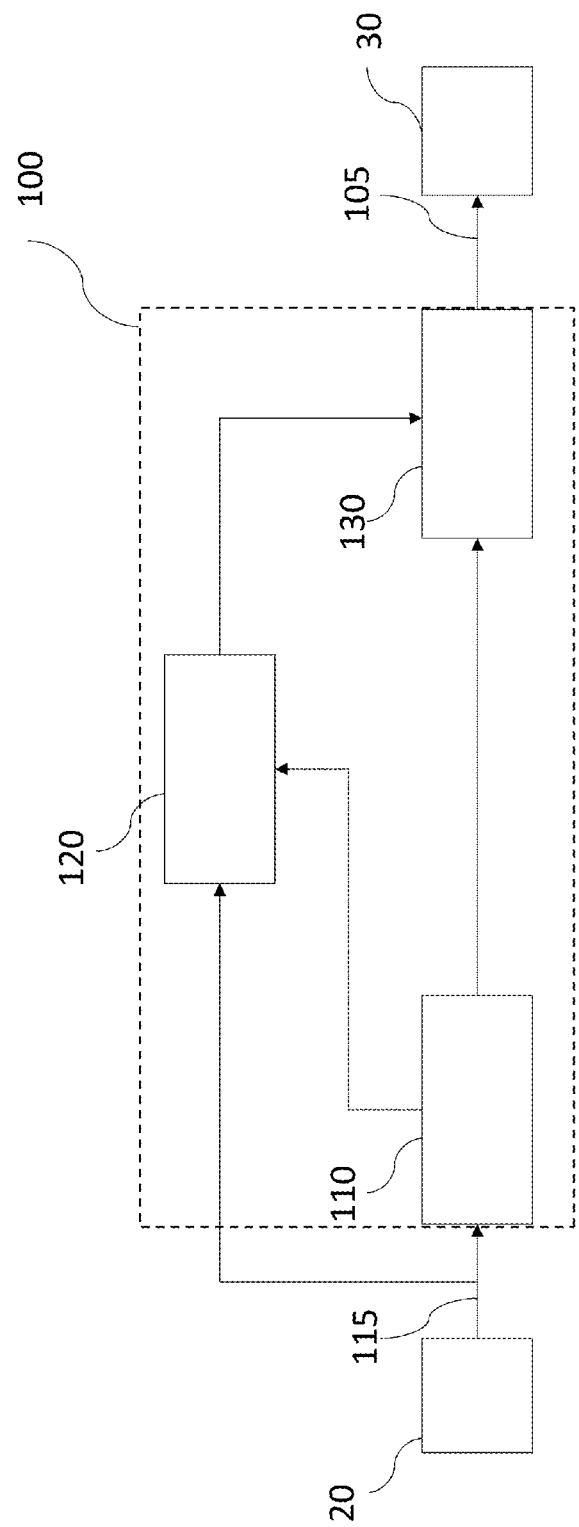
FIG. 1a depicts an apparatus for providing an error signal according to an embodiment of the present disclosure.

FIG. 1a depicts an apparatus 100 for providing an error signal 105a for a control unit 30 according to an embodiment. The error signal 105 indicates an internal malfunction of a sensor unit 20. The apparatus 100 comprises an input module 110 for receiving a sensor signal 115 from the sensor unit 20. The apparatus 100 further comprises a determination module 120, which is configured to determine the internal malfunction of the sensor unit 20 or the apparatus 100. The apparatus 100 further comprises an output module 130, which is configured to provide the error signal 105 indicating the malfunction for the control unit 30. The sensor signal 115 may be a periodic signal. Further, the error signal 105 comprises a predetermined level of a physical quantity (e.g. voltage or current), which differs from an upper level and from a lower level (of the physical quantity) used for providing periodic information of the sensor signal.

The sensor unit 20 (e.g. magnetic field sensor, giant magnetoresistance based sensor) may provide an analog periodic sensor signal (e.g. indicating a magnitude of the magnetic field by the amplitude of the sensor signal) to the input module 120a, for example.

The input module 110 (e.g. analog to digital converter) may process the sensor signal. For example, the input module may convert the analog periodic signal to a digital signal and/or may detect a zero crossing of the sensor signal 115.

The determination module 120 may determine a malfunction of the sensor unit 20 or the apparatus based on the senor signal 115 (e.g. analog periodic sensor signal) or an output signal of the input unit 110 (e.g. digital periodic sensor signal) or another signal derived from the sensor signal to obtain an output sensor signal (e.g. providing periodic information of the sensor signal) to be provided by the output module 130.

The determination module 120 may generate the error signal 105 to be provided by the output module 130 or may trigger the output module 130 to generate the error signal 105 (e.g. by interrupting the transmission of the periodic information of the sensor signal or additional information and providing the error signal).

The output module 130 provides the error signal 105. Further, the output module 130 may provide an output sensor signal indicating periodic information of the sensor signal.

The periodic information of the sensor signal may be represented by pulses of the physical quantity (e.g. current) within the output sensor signal. For example, the current of the output sensor signal rises from the lower level to the upper level at the time the senor signal comprises a predefined magnitude (e.g. a zero crossing) and drops back to the lower level after a predefined pulse time interval.

Here and in the following embodiments the internal malfunction may relate to any internal error of the sensor unit 20 and/or the apparatus 100. It may for example relate to a failure of the sensor or an error in the data processing.

Figure 1B:
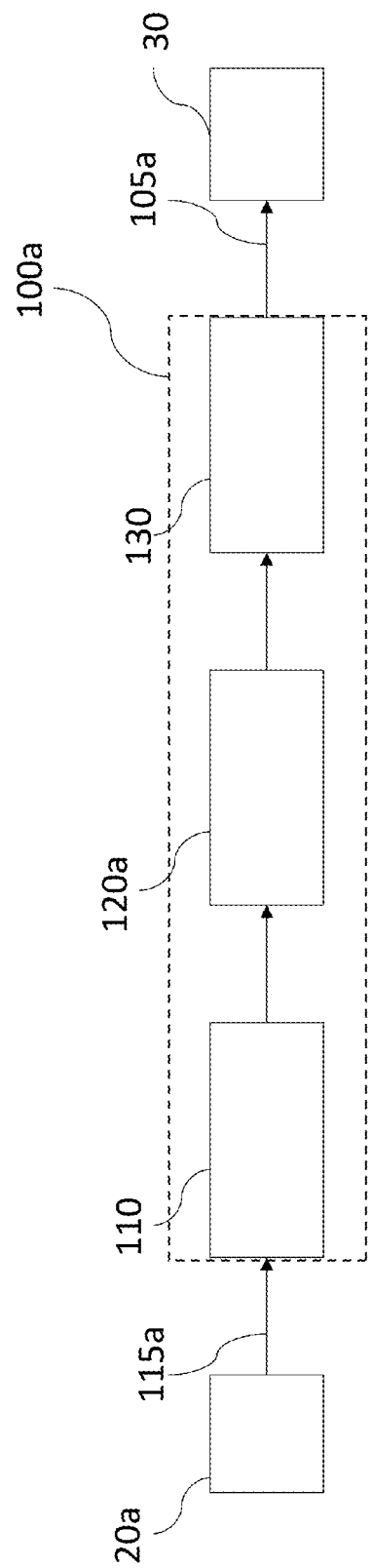
FIG. 1b depicts a further apparatus for providing a further error signal according to a further embodiment of the present disclosure.
Figure 1C:
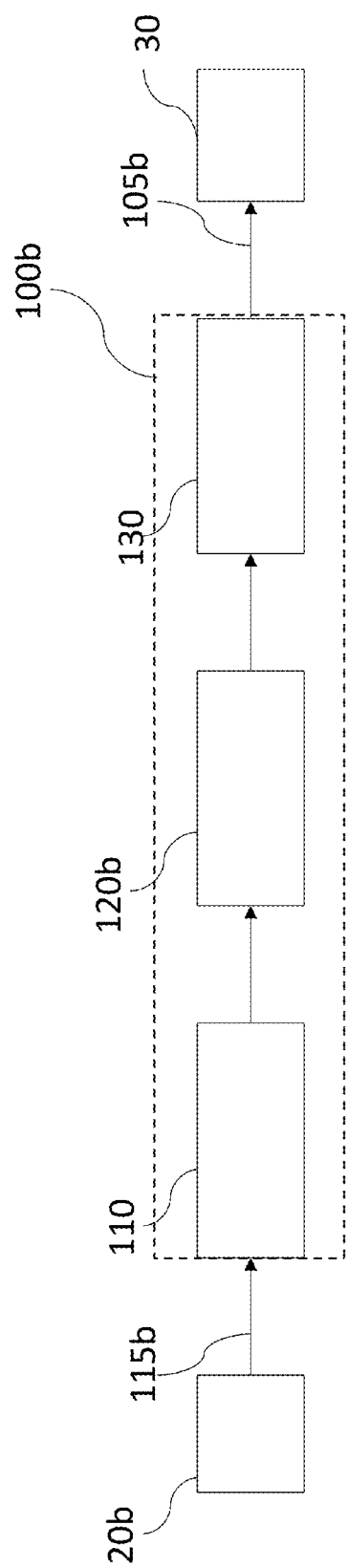
FIG. 1c depicts a further apparatus for providing a further error signal according to a further embodiment of the present disclosure.

FIG. 1b depicts an apparatus 100a for providing an error signal 105a for a control unit 30 according to an embodiment. The error signal 105a indicates a malfunction of a sensor unit 20a. The apparatus 100a comprises an input module 110 for receiving a sensor signal 115a from the sensor unit 20. The apparatus 100a further comprises a determination module 120a, which is configured to determine the malfunction of the sensor unit 20a. The apparatus 100a further comprises an output module 130, which is configured to provide the error signal 105a indicating the malfunction for the control unit 30. The sensor signal 115a may be a periodic signal between an upper level (or higher level or high-level) and a lower level (or low-level) of a physical quantity and the error signal 105a comprises a predetermined level of the physical quantity, which differs from the upper level and from the lower level.

Here and in the following embodiments the malfunction may relate to any internal error of the sensor unit 20 and/or the apparatus 100a. It may for example relate to a failure of the sensor or an error in the data processing or an overheating condition or other malfunctions that may or may not result in incorrect or at least non-reliable measurements of the sensor unit 20 or the transmission of the corresponding signals. Also bit errors in an internal sensor memory may be a malfunction signaled to the control unit 30.

The predetermined level of the physical quantity (e.g. an electric current) may differ from the upper level by at least by a first offset (e.g. by at least 10% or at least 20% of the upper level) and from the lower level by at least a second offset (e.g. by at least 10% or at least 20% of the lower level). The first offset and the second offset may or may not be equal.

FIG. 1b depicts a further apparatus 100b for providing a further error signal 105b to the control unit 30 according to an embodiment. The further error signal 105b indicates a malfunction of the sensor unit 20b. The apparatus 100b comprises an input module 110 for receiving a sensor signal 115b from a sensor unit 20b. The sensor signal 115b is a periodic signal in a physical quantity (e.g. an electric current or voltage). The apparatus 100b may optionally comprise a determination module 120b, which is configured to determine the malfunction of the further sensor unit 20b. The apparatus 100b further comprises an output module 130 which is configured to provide the error signal 105b for the control unit 30. The error signal 105b comprises a predetermined level of the physical quantity for a predetermined time period.

The apparatus 100b differs from the apparatus 100a, for example, by providing (or transmitting) the error signal for a predetermined period of time. For example, the apparatus may be configured to transmit a sequence of alive signals indicating an operational state of the sensor unit. The output module 130 may be configured to transmit the further error signal 105b for a predetermined time period being longer than two subsequent alive signals of the sequence of alive signals. Therefore, the predetermined period may be longer than the time period between two subsequent alive signals. As a result, the control unit 30 may be informed that, although the sensor unit 20 is still alive, it does not function appropriately.

Further embodiments relate to limitations applicable to both the apparatus 100a and the apparatus 100b so that in the following the distinction between the apparatus 100a and the apparatus 100b is only made where the differentiating features are added only to one of the apparatuses 100a, 100b. Therefore, all further limitations described with respect to the sensor unit 20, the determination unit 130, sensor signals 115 and error signals 105 are applicable in the same way for the sensor unit 20b, the determination unit 120b, sensor signals 115b and error signals 105b. Moreover, examples for the error signal 105a and the error signal 105b are described in conjunction with FIGS. 3 to 6.

The determined malfunction may relate to several different malfunctions that may occur in a sensor unit 20. Hence, according to further embodiments the malfunction may be included in a plurality of malfunctions. The determination module 120 is configured to determine different malfunctions of the plurality of malfunctions and the output module 130 is configured to select different predetermined levels from a plurality of levels based on the different malfunctions. The output module 130 may be further configured to select the predetermined levels being below the lower level, or between the lower level and the upper level, or above the upper level, if periodic information of the sensor signal 115 is a periodic signal fluctuating between the upper level and the lower level of a physical quantity.

The malfunction may either be signaled by a signal received from the sensor unit 20 or be derived by analyzing the sensor signal 115, or a combination thereof.

Therefore, in further embodiments the determination module 120 is configured to determine the malfunction by analyzing the sensor signal 115 transmitted from the sensor unit 20. This analysis may include a comparison of a received sensor signal 115 with an expected sensor signal. For example, the received sensor signal may have wrong levels of the signal. Furthermore, the upper and lower levels may have not the expected values (e.g. 7 mA and 14 mA), or the edge steepness may not have the expected value, or the signal is not periodic with a meaningful frequency (dependent on the particular application) related to an expected normal rotation speed (but not multiple thereof).

For example, the periodic information of the sensor signal and the error signal may be provided through the same transmission line (wired transmission) or the same transmission channel (wireless transmission). For example, by using different levels of the physical quantity, the error signal may be identified and/or distinguished from the sensor signal, although the same transmission line or the same transmission channel may be used.

More details and aspects are mentioned in connection with embodiments described above or below. A proposed apparatus may comprise one or more optional additional acts corresponding to one or more aspects mentioned in connection with the proposed concept or one or more embodiments described above or below.

Figure 2:
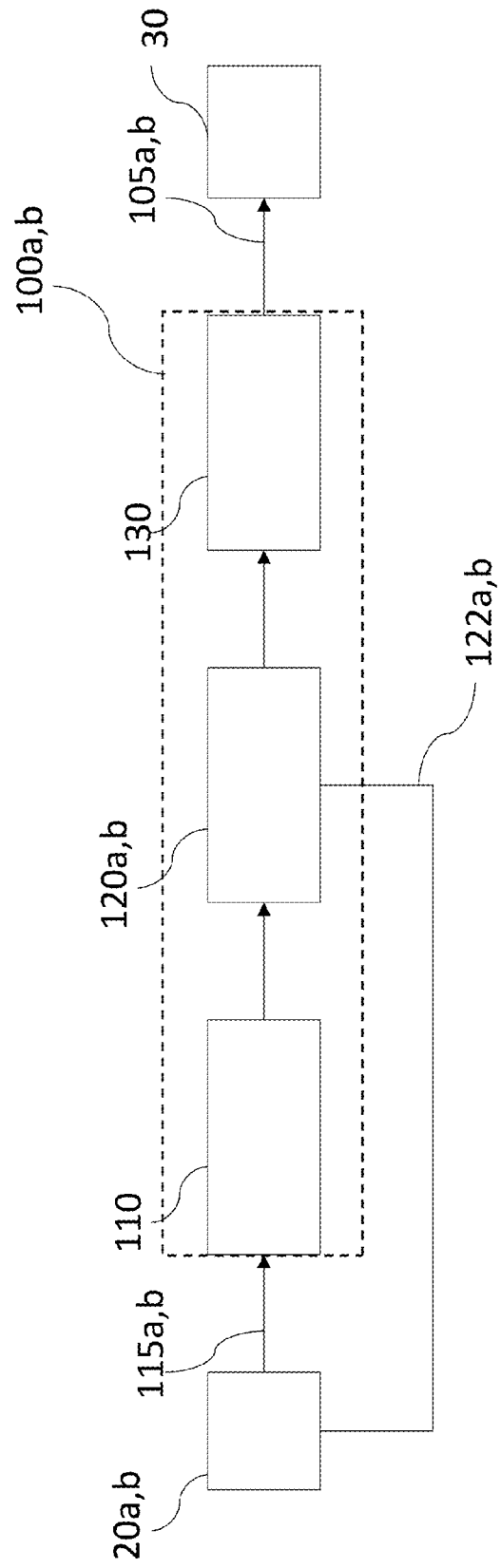
FIG. 2 depicts an apparatus for providing an error signal using an error indication line.

FIG. 2 depicts a further embodiment of the apparatus 100 that differs from the embodiments depicted in FIGS. 1a, 1b and/or 1c in that an optional error indication line provides an additional channel for transmitting an indication signal 122a, b to the determination module 120. All other shown components are the same as in FIGS. 1a, 1b and/or 1c. A repetition of the description of those components is omitted here.

In the embodiment shown in FIG. 2, the determination module 120 may determine the malfunction based on the received indication signal from the sensor unit 20. The determination module 120 may forward the sensor signal 115 as long as no malfunction is determined. However, when the sensor unit 20 transmits an error indication signal indicating an error or any kind of malfunction, the determination module 120 may stop forwarding the sensor signal 115 and may cause the output module 130 to output the error signal 105.

Therefore, in further embodiments the apparatus 100 may optionally comprise an error indication line input. The sensor unit 20 is configured to indicate the malfunction by transmitting an error indication signal 122 via an error indication line connectable to the error indication line input, and the determination module 120 is configured to receive the error indication signal 122 from the error indication line input and to determine the malfunction based on the received error indication signal 122.

In further embodiments, the error indication signal may not be forwarded using a separate line, but may be transmitted over the same line as the sensor signal 115a, b (e.g. on a different channel).

In yet another embodiment the sensor unit 20 may also be configured to detect the malfunction and if the malfunction is detected, the transmission of the sensor signal 115 is ceased and instead the error indication signal 122a, b is transmitted over the same line or a different line.

The output module 130 may further be configured to output the error signal 105 only if the determination module 120 has determined the malfunction of the sensor unit 20. If no malfunction has been determined, the determination module 120 may forward the sensor signal 115 to the output module 130, which transmits the sensor signal 115 to the control unit 30. Therefore, in further embodiments the determination module 120 is further configured to receive and to forward the sensor signal 115 to the output module 130 for providing the sensor signal 115 for the control unit 30, when no malfunction is determined.

For example, an apparatus for providing an error signal for a control unit corresponding to one or more embodiments described above or below and a sensor unit providing the sensor signal and/or the error signal to the apparatus for providing an error signal for a control unit may be implemented on the same semiconductor die. The control unit may be an external electrical unit (e.g. the electronic control unit (ECU) used in automotive applications, a microcontroller or a processor) coupled (wired or wirelessly) to the apparatus for providing an error signal for a control unit.

More details and aspects are mentioned in connection with embodiments described above or below. A proposed apparatus may comprise one or more optional additional acts corresponding to one or more aspects mentioned in connection with the proposed concept or one or more embodiments described above or below.

Further embodiments may also relate to systems as, for example, wheel speed sensors. Such sensors may be used in ABS (anti-lock braking systems) and gearing applications, in particular, if those systems provide only an insufficient feedback with respect to internal malfunctions or failures.

Therefore, further embodiments define a system for detecting a speed of a wheel. The system may comprise an apparatus 100a, 100b, a sensor unit or detector unit and a transmission unit. The sensor unit is configured to generate the sensor signal indicating information on the speed of a wheel. Further, the transmission unit is configured to transmit the sensor signal 115 indicating the detected speed of the wheel to the apparatus 100.

The system may optionally comprise a wheel with periodic magnetic pole structures so that a rotation of the wheel is detectable by a periodic magnetic field. The periodic magnetic poles are arranged along a circumference of the wheel, thereby generating a periodic electric signal from periodic variation of the magnetic field when the wheel rotates.

For example, the error signal generated by the apparatus 100a, 100b may indicate a system-internal malfunction. A system-internal malfunction may be an error occurring inside the apparatus 100a, 100b, the sensor unit or the transmission unit.

Optionally, the system may further comprise the control unit 30 or the control unit 30 may be an external unit coupled to the system.

Furthermore, in the system the transmission unit may optionally be configured to encode information in the sensor signal using a protocol. The protocol may use a pulse width modulation or an amplitude modulation. The information may be indicating a wheel speed and at least one of the following: a rotational sense, an air gap information in the detector, further information indicating an operational state of the sensor. In these systems an integrated, active magnetic field sensor may be used for the wheel speed application based on Hall technology to measure the speed of a pole wheel or a ferromagnetic-toothed wheel. It may have a two wire-current interface using a particular protocol for communication.

Therefore, embodiments may use rotational speed sensors employing a protocol for submitting further information. This further information may, for example, include wheel speed information, optional rotation direction information, chip internal status information, or error indications. The protocol may transmit the rotational speed with a signal (e.g. a current signal) fluctuating between a low-level current (e.g. substantially 7 mA) and a high level current (e.g. substantially 14 mA). Also open drain protocols with an additional output pin may be used. Here and in the following the mentioned value may differ within a range of ±10% or ±50%.

The sensor signal 115 may encode the wheel speed information in a frequency of the periodic sensor signal 115 implementing the output protocol. The rotational sense may be encoded in a width of the signal (e.g. using pulse width modulation) or in an amplitude of the signal (e.g. using an amplitude modulation protocol). Therefore, it becomes possible to transmit to the control unit 30 (ECU) enhanced sensor information, which indicates malfunctions of the rotational speed sensor to ensure a secure operational state. Such failure indication states or safe states comply with respective requirements. As a result, in addition to external errors, also internal malfunctions of the sensor can be noticed externally, which is desirable in automotive standards to provide a high level of functional security of E/E-systems (electric and electronic systems).

In some error indication apparatuses, the error signal comprises the same level as the lower level or the higher level in the protocols to transmit the rotational speed information. However, it may improve the reliability of the error detection and error signaling to output the error signal with a level, which is different from the lower level and higher level used. For example, when using a constant current signal with a level equal to the lower level or the higher level, this may not be distinguishable from a state of rest of the vehicle wheel (for example in ABS applications). Moreover, e.g. due to insufficient power supply or any other error, the system may not be able to supply a signal having the lower level or higher level current (as for example 7 mA or 14 mA), but an offset will be generated. A standstill of a vehicle wheel may, according to embodiments, also be indicated by a constant current level, which may correspond to the latest magnetic field. Hence, in case of an error, it may become not possible to indicate a safe operational state to the control unit 30. Therefore, the safe state as demanded by current vehicle requirements may not always be uniquely signalized, if the only the low-level and/or high-level are used for error signaling.

In the following embodiments error signals are described, wherein (electric) current signals are employed for signaling the malfunction and for transmitting the sensor signal. Therefore, the afore-mentioned physical quantity (see FIGS. 1a, 1b, 1c and 2) is in the following embodiments the electric current. However, the present invention is not limited thereto. In further embodiments other signals may used to encode the sensor signal or the error signal (e.g. a voltage or a frequency).

More details and aspects are mentioned in connection with embodiments described above or below. A proposed apparatus may comprise one or more optional additional acts corresponding to one or more aspects mentioned in connection with the proposed concept or one or more embodiments described above or below.

Figure 3A:
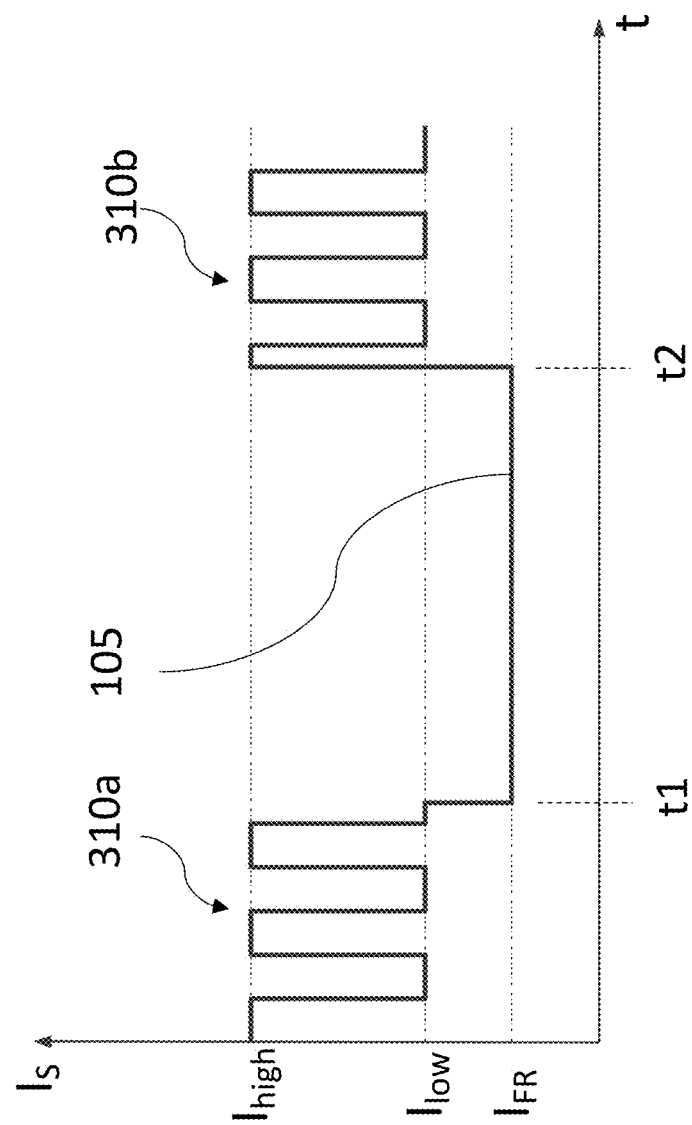
FIGS. 3a to 3c depict sensor signals with a failure reaction signal indicating a malfunction of a sensor unit according to an embodiment.
Figure 3B:
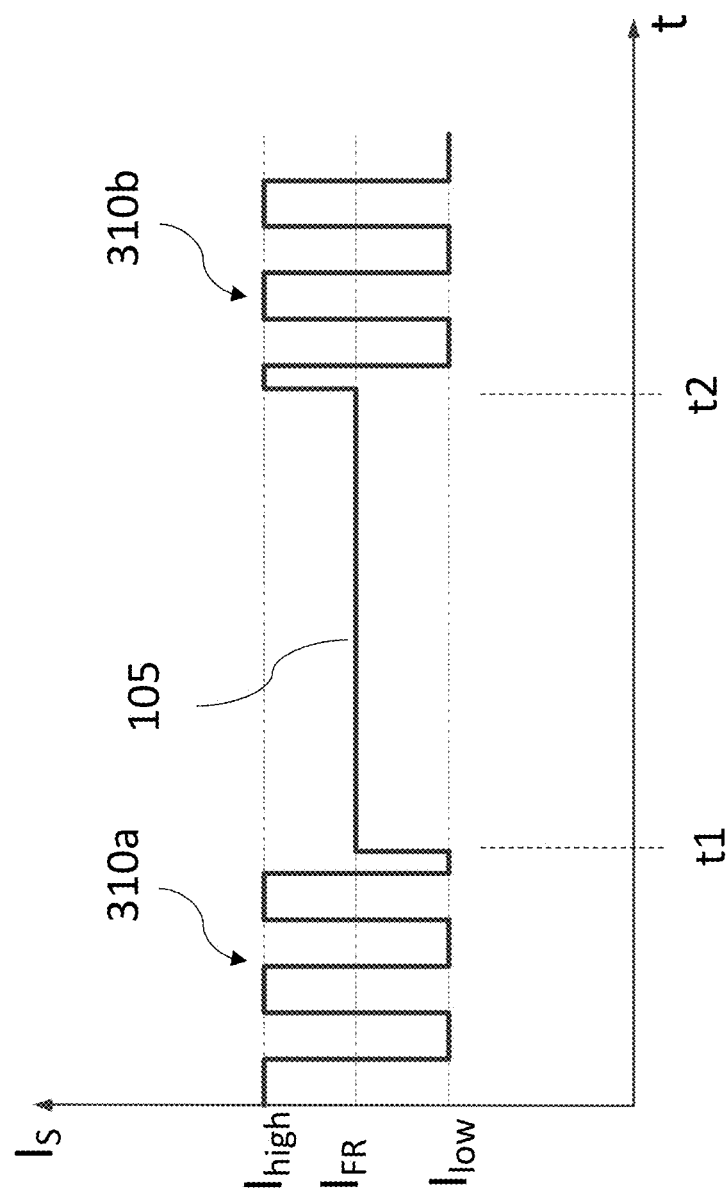

FIGS. 3a to 3b depict an embodiment wherein the error signal 105 may comprise different levels to indicate internal status information (for example related to errors). The error signal 105 is thus a failure reaction signal having a constant current $I_{FR}$.

FIG. 3a shows a sensor signal 310a, b as a sensor current $I_S$, which is interrupted between a first time t1 and a second time t2 by an error signal 105, i.e. a first portion 310a of the sensor signal 310 is transmitted before the first time t1 and a second portion 310b of the sensor signal 310 is transmitted after the second time t2. During normal operation the sensor signal 310a, b in this embodiment is a periodic signal fluctuating between a high-current level $I_{HIGH}$ and a low-current value $I_{LOW}$. The frequency of this periodic signal 310a, b may be correlated to the rotational speed of a rotating wheel. If an internal malfunction or failure occurs in the sensor unit 20 (e.g. at the first time t1), the apparatus 100 may transmit the error signal 105 with a predetermined level $I_{FR}$ (FR=Failure Reaction).

In the present embodiment the predetermined level $I_{FR}$ of the error signal 105 is below the lower level $I_{LOW}$. This signal is transmitted to the control unit 30 to indicate that an error has occurred in the sensor or sensor unit. The predetermined level $I_{FR}$ may also have 0 mA (no electric current) dependent on the particular implementation.

At the second time t2 the sensor unit 20 may resume normal operation and the regular sensor signal 310b can be transmitted again. Therefore, the error signal 105 may be transmitted as long as the malfunction is present. In further embodiments the error signal 105 may be transmitted repeatedly to indicate that the sensor unit 20 exhibits a malfunction. The latter case may be used if the malfunction is only minor so that a continued transmission of the rotational speed may be desirable, for example.

FIG. 3b depicts an embodiment, wherein the predetermined level $I_{FR}$ is not below the lower level $I_{LOW}$ but is between the lower level $I_{LOW}$ and the higher level $I_{HIGH}$. Again, the malfunction may occur at the first time t1 and lasts, for example, for a time period until the second time t2 where the sensor may resume the normal operation. As a result, beginning with the second time t2 the sensor signal 310*b* is again transmitted as a normal periodic signal fluctuating the between the high level $I_{HIGH}$ and the low level $I_{LOW}$ with a frequency indicating an exemplary rotation of a wheel.

Figure 3C:
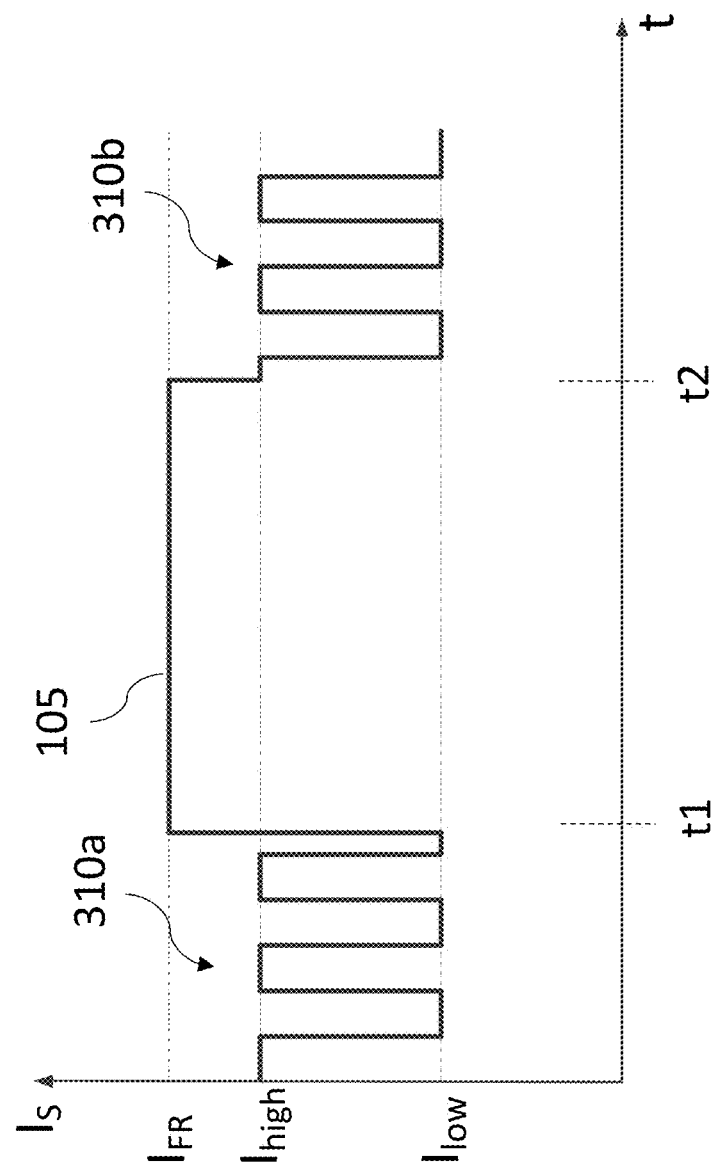

FIG. 3*c* is a further embodiment, wherein the predetermined level $I_{FR}$ is above the high level $I_{HIGH}$. Again, all other features are the same as in the example depicted in FIGS. 3*a* and 3*b* and a repetition is omitted here.

The embodiments depicted in FIGS. 3*a* to 3*c* allow further the possibility to indicate at least three different variants of errors by selecting the predetermined current level $I_{FR}$ accordingly. For example, a first error may be indicated with a predetermined current level $I_{FR}$ being below the low level $I_{LOW}$, a second error may be indicated with a predetermined current level $I_{FR}$ being between the low level and the high level, and third error may be indicated with a predetermined current level $I_{FR}$ above the high level. By selecting the different predetermined levels $I_{FR}$, the low level and the high level any erroneous detection can be avoided and the control unit 30 can clearly detect various errors.

Figure 4A:
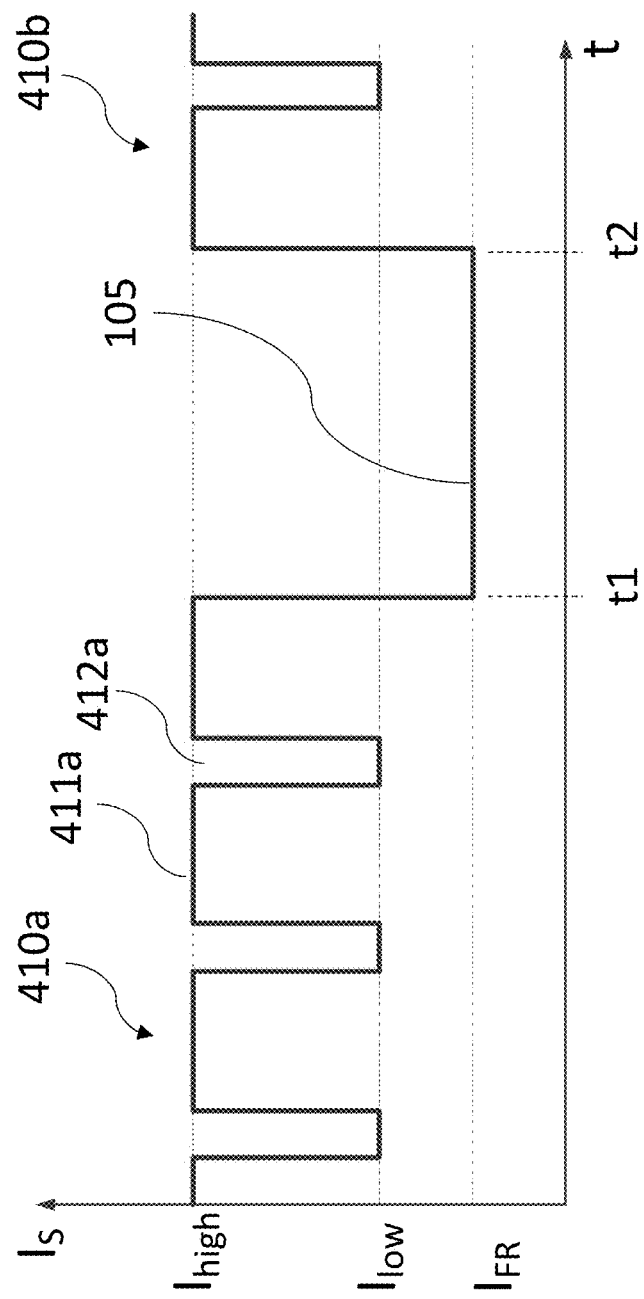
FIGS. 4a to 4c depict sensor signals using a pulse width modulation protocol including an error signal according to a further embodiment of the present disclosure.
Figure 4B:
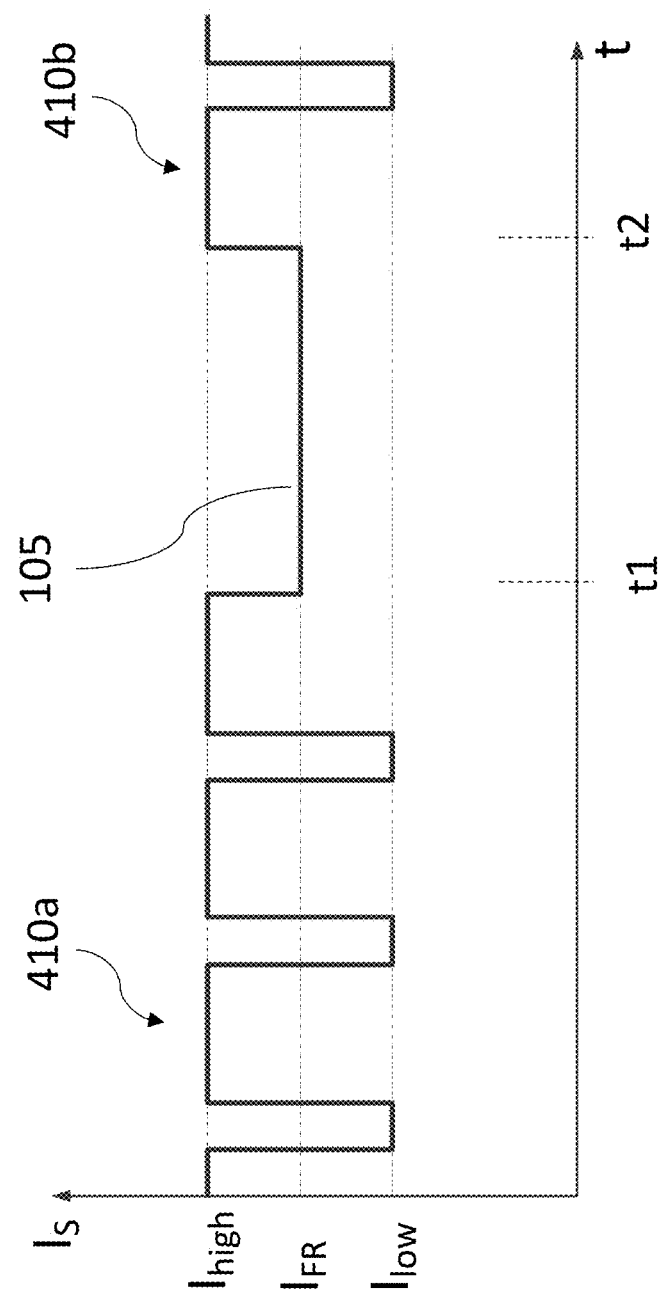
Figure 4C:
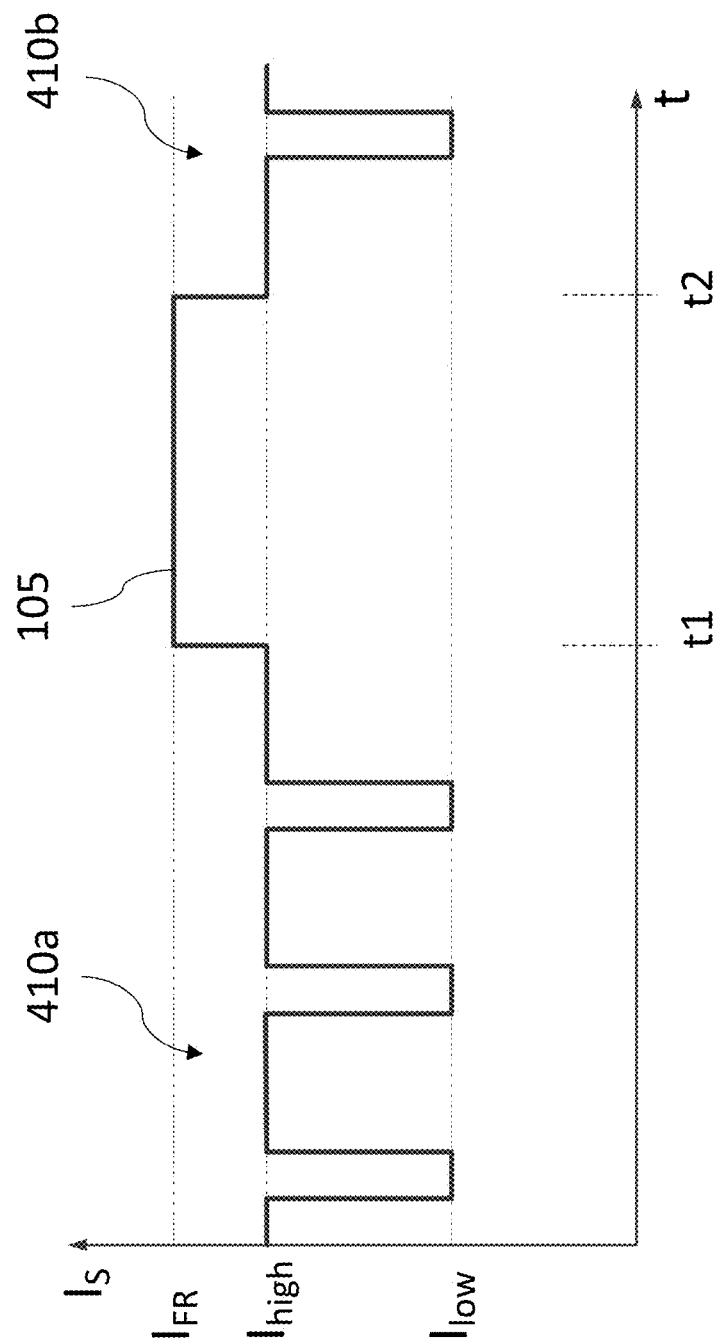

FIGS. 4*a* to 4*c* depict further embodiments, which are similar to the embodiments shown in FIGS. 3*a* to 3*c*, but differ merely by the sensor signal 410*a*, *b* again comprising a first part 410*a* transmitted before the first time t1 and a second part 410*b* transmitted after a second time t2. Again, during normal operation the sensor 20 transmits a periodic current signal $I_S$ fluctuating between a high level $I_{HIGH}$ and a low level $I_{LOW}$. However, this embodiment employs a pulse width modulation protocol. Varying the pulse width of the signal may signalize further internal status information. Again, as in the example in the FIGS. 3*a* to 3*c*, the frequency may encode a rotational speed of the wheel. In addition, further information (as for example the rotational direction) may be indicated by the width of each pulse.

An error or malfunction may again occur between the first t1 to the second time t2. As result, the output module 130 may indicate this malfunction by transmitting an error signal 105 with a constant current level $I_{FR}$, which is different from the high current level $I_{HIGH}$ and the low current level $I_{LOW}$.

FIG. 4*a* depicts the possibility that the error signal 105 has a predetermined current level $I_{FR}$ below the low level $I_{LOW}$, whereas FIG. 4*b* depicts the possibility that the predetermined level $I_{FR}$ is between the high level $I_{HIGH}$ and the low level $I_{LOW}$. Finally, FIG. 4*c* depicts the example wherein the predetermined level $I_{FR}$ is above the high level $I_{HIGH}$. Again, the predetermined level $I_{FR}$ shown in FIG. 4*a* can also comprise a zero value (e.g. 0 mA) and may, for example, indicate a detached bonding wire or any other failure in the voltage supply.

Again, the different current levels can be used to signalize different errors or malfunctions within the sensor unit 20 so that the control unit 30 may derive the type of error from the level of the error signal 105.

The limitation of using the predetermined level (e.g. the third current level) may be dependent on the variant of the protocol of the sensor. Further embodiments relate also to sensor units 20 transmitting alive signals to the control unit 30. The alive signal may be transmitted in regular periods to signal the control unit 30 that the sensor unit 20 is still alive—even in case of a standstill of the wheel. Hence, from a non-rotating wheel, the control unit 30 may not infer that the sensor unit 20 is malfunctioning.

Thus, if a standstill of a wheel is detected the standstill protocol may be activated, a periodic signal with predetermined period (e.g. 100, 150 or 200 ms or any other selected time period) is transmitted. In further embodiments the periodic signal is always transmitted as along as the sensor unit 20 is in an operational state (i.e. alive). Therefore, the control unit 30 expects at least this (amplitude-modulated) signal and if the control unit 30 does not receive this alive signal from the sensor 20, the control unit 30 may detect an error. Therefore, according to embodiments, the apparatus 100 may signal a malfunction by transmitting an error signal 105, which is longer than the predetermined period. The predetermined level of the error signal 105 may be equal to the lower level or the higher level (for example equal to 7 mA or 14 mA), but may also be different (e.g. as depicted in the FIGS. 3 to 4).

Therefore, embodiments are not limited to apparatuses, which indicate an error by transmitting a constant current signal of a particular, distinguishable current level from the upper and lower level, but can also transmit any constant current independently from the current levels used for indicating the rotation of the wheel. This current may or may not be transmitted for a predetermined time period to indicate the malfunctioning.

This way of signaling an error may enable that also a mechanical failure, as for example a detached bonding wire, may clearly be identified. A detached bonding wire may necessarily result in an unpredictable current signal (e.g. of 0 mA). Therefore, according to further embodiments, if the control unit 30 detects a constant current value for a predetermined time period (e.g. longer than 100 ms, 150 ms, 200 ms or any other particular period) the control unit 30 will identify this signal as an indication of a malfunction or failure of the sensor unit 20. On the hand, a detached bonding wire is one particular example of malfunction. The sensor may not be able to transmit an error current (e.g. of substantially 3.5 mA). Therefore, transmitting no signal (or zero current) may signal this error.

FIGS. 5*a* to 5*d* depict the example of a rotational speed sensor using a pulse width protocol and an alive signal.

Figure 5A:
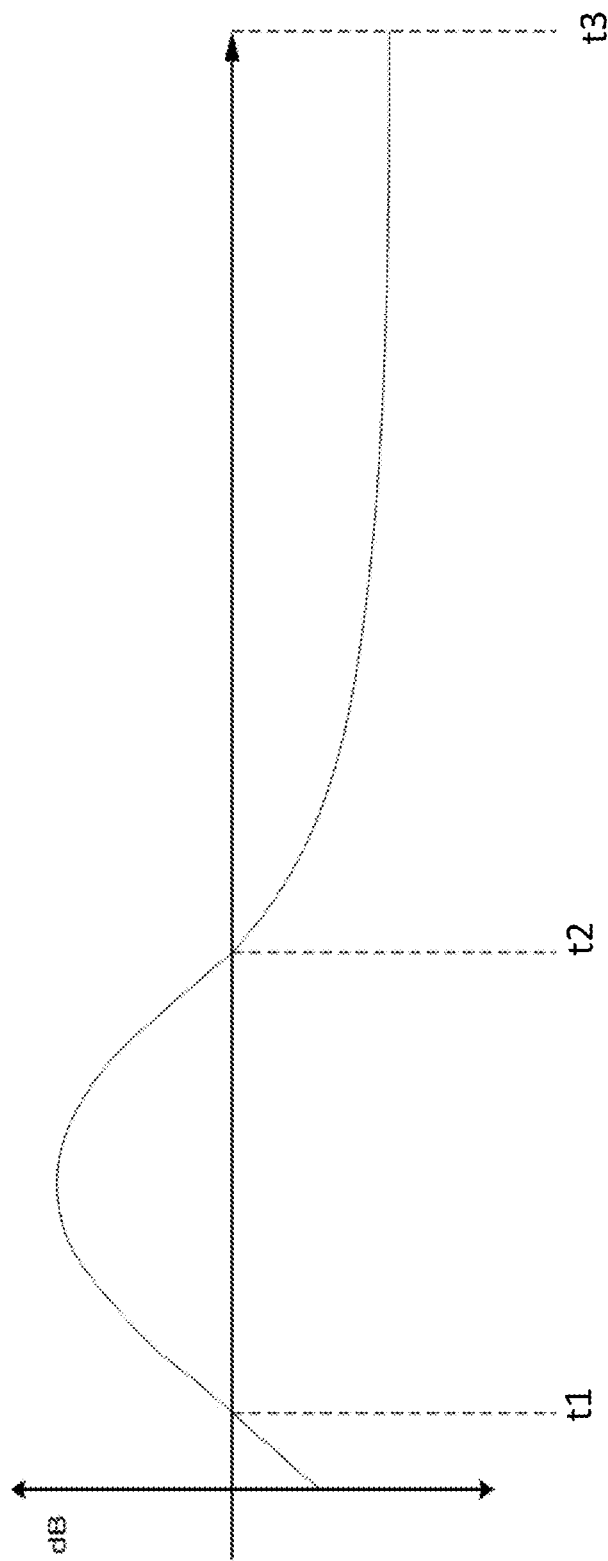

FIG. 5*a* shows a variation of the magnetic field in such sensors. Any variation of the magnetic field may indicate a rotation of the magnetic wheel so that the wheel is rotating from time t1 to t2, whereas starting at the second time t2 the wheel slows down and is at standstill at the third time t3.

Figure 5B:
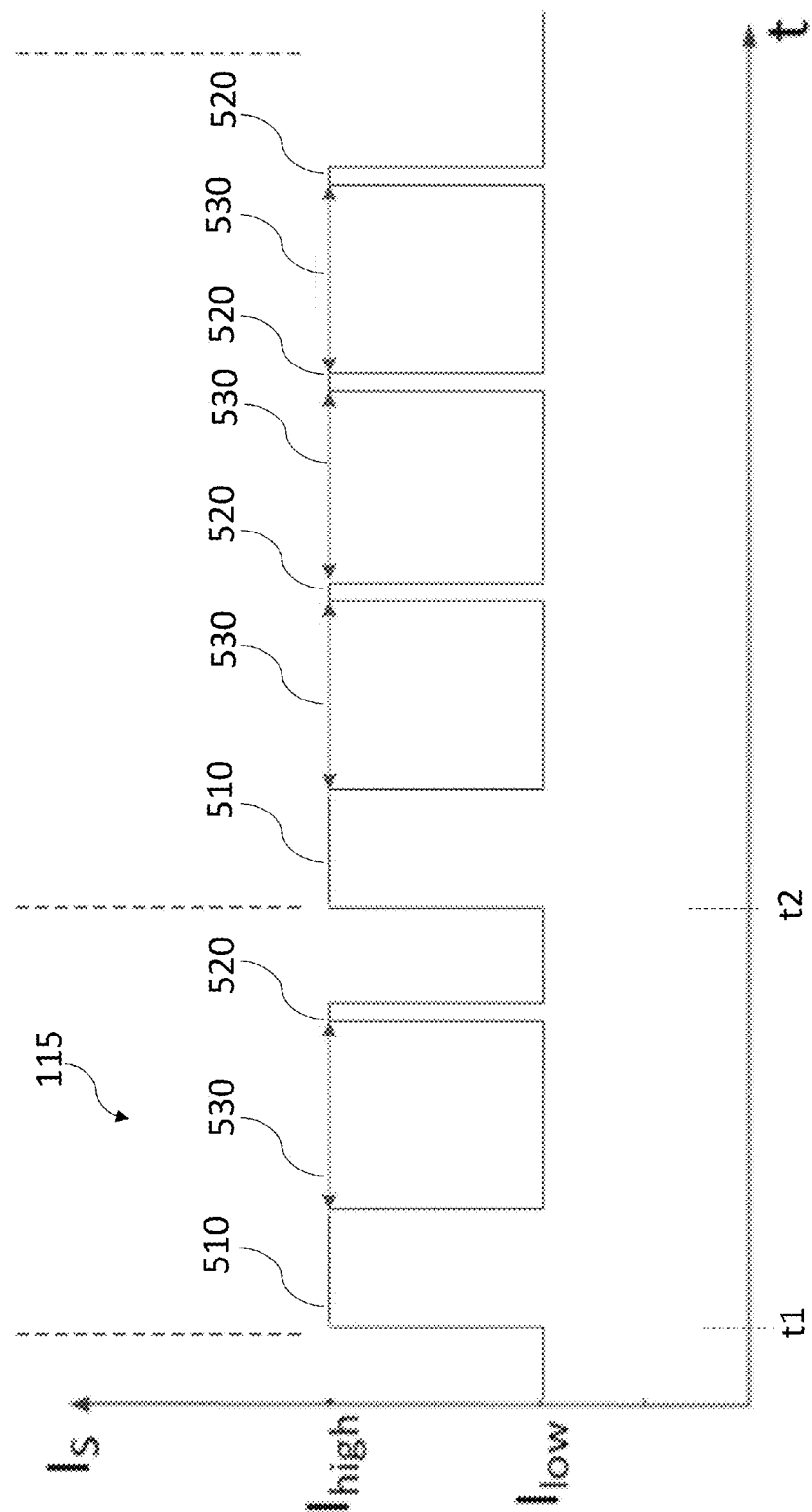

The sensor signal 115 of this normal operation is indicated in FIG. 5*b*. The sensor signal 115 is again a current signal $I_S$ transmitted to the control unit 30 being fluctuating between a high level $I_{HIGH}$ and the low level $I_{LOW}$. Speed pulses 510 are generated at the first time t1 and the second speed t2, where the magnetic field B crosses zero. After the second time t2 no further zero crossing occur and thus no further speed pulse are transmitted.

Rotational speed sensors may measure the rotation speed based on differential magnetic fields of magnet target wheels, which are attached to the wheel. They may generate an output signal, which represents the motion of these objects. Additionally, the direction of rotation of a rotating target wheel and the quality (strength) of the magnetic signal may be detected. Hence, the rotation of the wheel may be indicated by periodic alternating poles which produce a fluctuating magnetic field with periodic zero crossings. Any zero crossing of the magnetic field can be used to transmit a speed pulse 510. If the magnetic field does not exhibit a zero crossing, no speed pulse 510 is transmitted. At the second time t2 the last speed pulse is generated. This will indicate that the wheel does not rotate any longer.

In addition, as it is depicted in FIG. 5*b*, in predetermined time intervals 530, alive signals 520 will be transmitted indicating that the sensor is still operating, even though the wheel does not rotate anymore. For example, the time intervals 530 may be periodic intervals of predetermined length. The predetermined length between the end of a speed pulse 510 and the time of transmitting the alive signal 520 may be any particular time period as for example 150 ms (or 100 ms or 200 ms).

Furthermore, if the speed pulse 510 is not transmitted, for example due to a standstill of the wheel, the time interval 530 can also be measured between two alive signals 520 (see last three alive signals 520 in FIG. 5*b*). As a result, if the control unit 30 does not receive a signal for longer than the time interval 530, the sensor unit 20 may not be alive, i.e. an error has occurred.

In a further embodiment the alive signals 520 may be transmitted irrespectively whether or not a speed pulse 510 is transmitted. In this embodiment the interval between subsequent pulses may differ, i.e. if a speed pulse 510 is transmitted, the time interval 530 is shorter compared to the situation if no speed pulse 510 is transmitted.

FIG. 5*c* indicates the occurrence of a malfunctioning as, for example, in detached bond wire occurring around a first failure time 550. The detached bond wire may result in a rapid drop in the current signal (a zero current). In this case no alive signal can be transmitted any longer. Therefore, the expected alive signal at time 540 is missing. The control unit 30 may infer from the absence of a signal for a waiting period 532 that the power supply or a bond wire has been detached and interpret this as serious error.

Figure 5D:
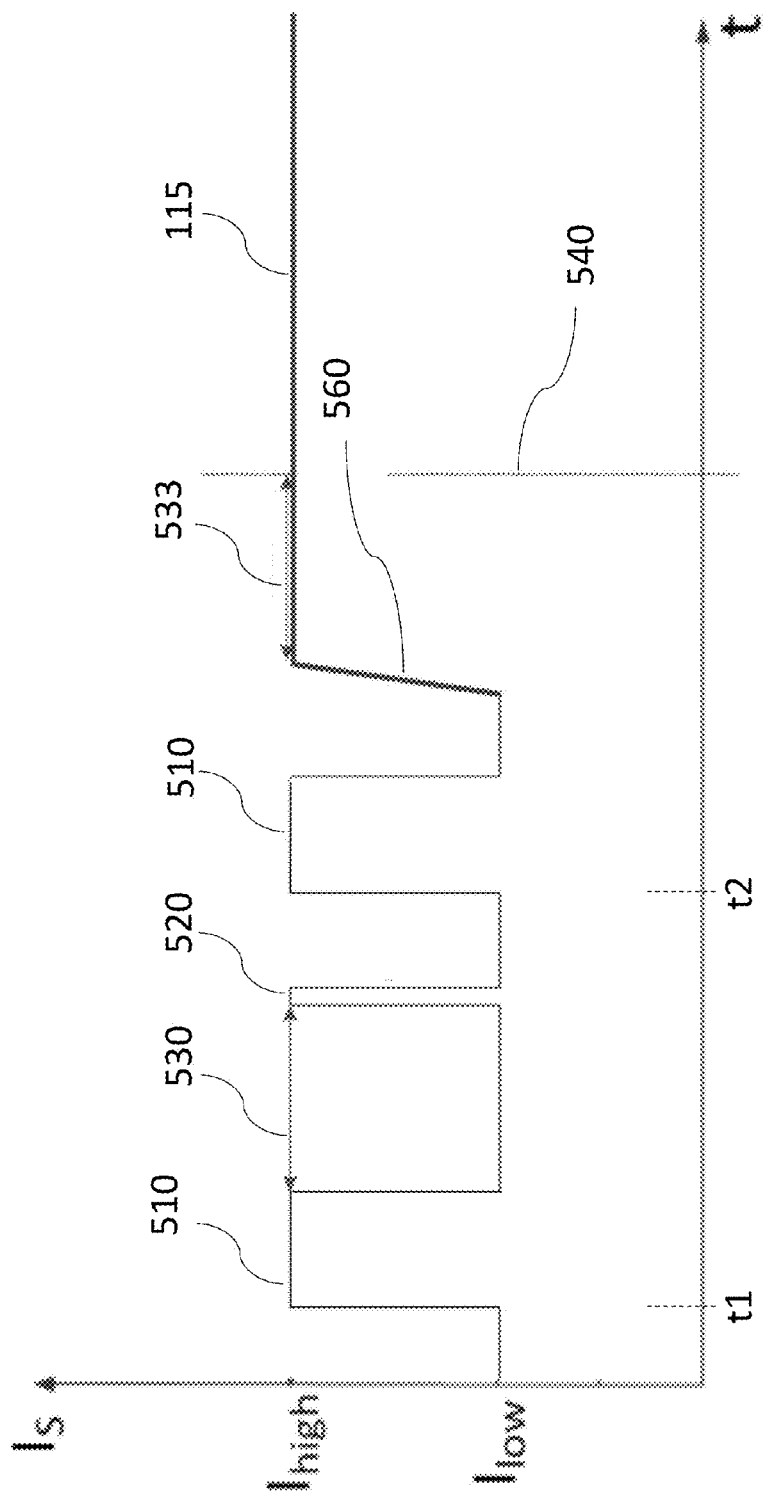

FIG. 5*d* depicts an embodiment with the sensor unit 20 operating correctly until a second failure time 560. Before this time the sensor is in normal operation transmitting a speed pulse 510 at each time the magnetic field is reversed (zero crossing) and alive signals 520 are transmitted, for example, every 150 ms after the end of each speed pulse 510.

At the second failure time 560, an error occurs as, for example, a lasting malfunctioning of the current driver. This error may be indicated by a constant high level error current starting at the second failure time 560. Again, no alive signal can be transmitted (or will be detected by the control unit 30), because the current output is constantly at the high level. The control unit 30 may interpret a high level signal for at least a second waiting period 533 (i.e. a lasting high level signal instead of pulses) as an error in the sensor.

Both examples depicted in FIGS. 5*c* and 5*d* can clearly be distinguished from the correctly operating sensor as depicted in FIG. 5*b*, wherein merely a standstill of the wheel has occurred, because the alive signals 520 are still correctly transmitted. From the absence of the alive signals 520 in FIGS. 5*c* and 5*d*, the control unit 30 can derive two different kinds of errors: a power supply error and error in the current driver.

The embodiments described in conjunction with FIGS. 5*a* to 5*d* may be combined with the embodiments described in conjunction with FIGS. 3*a* to 4*c* so that many different malfunctions can correctly be signaled.

Figure 6B:
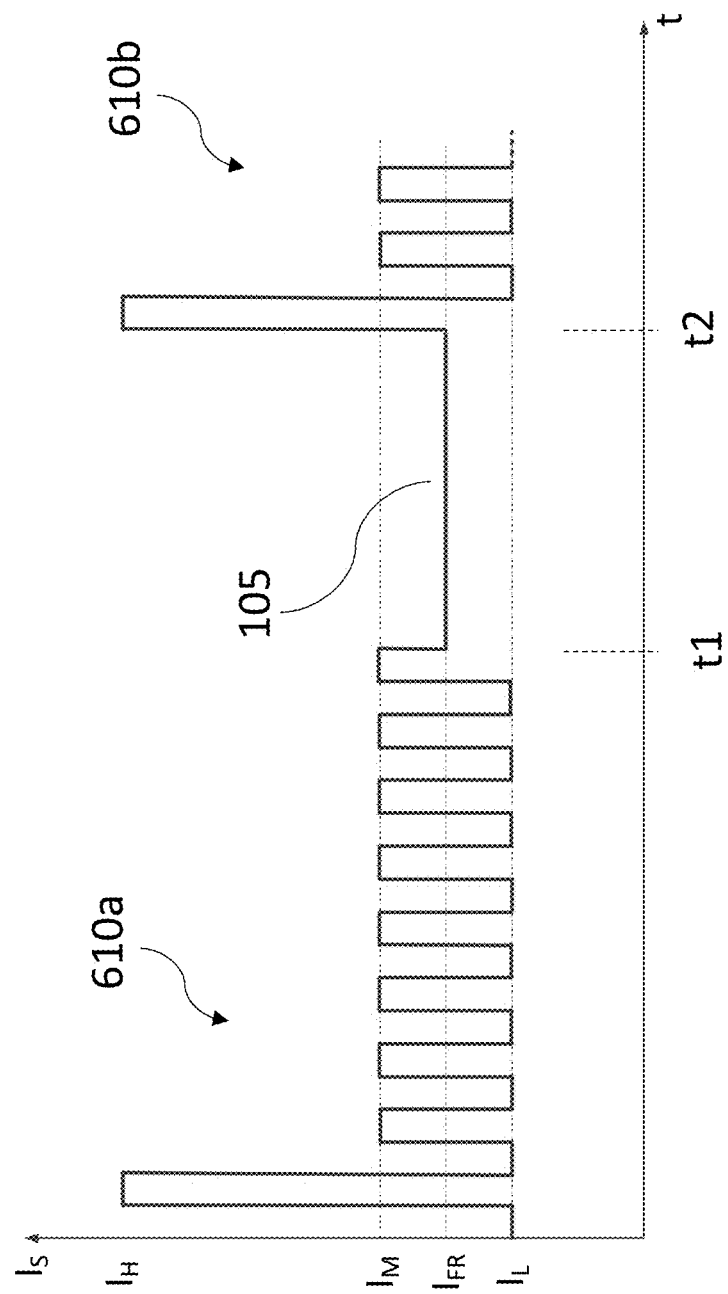
Figure 6C:
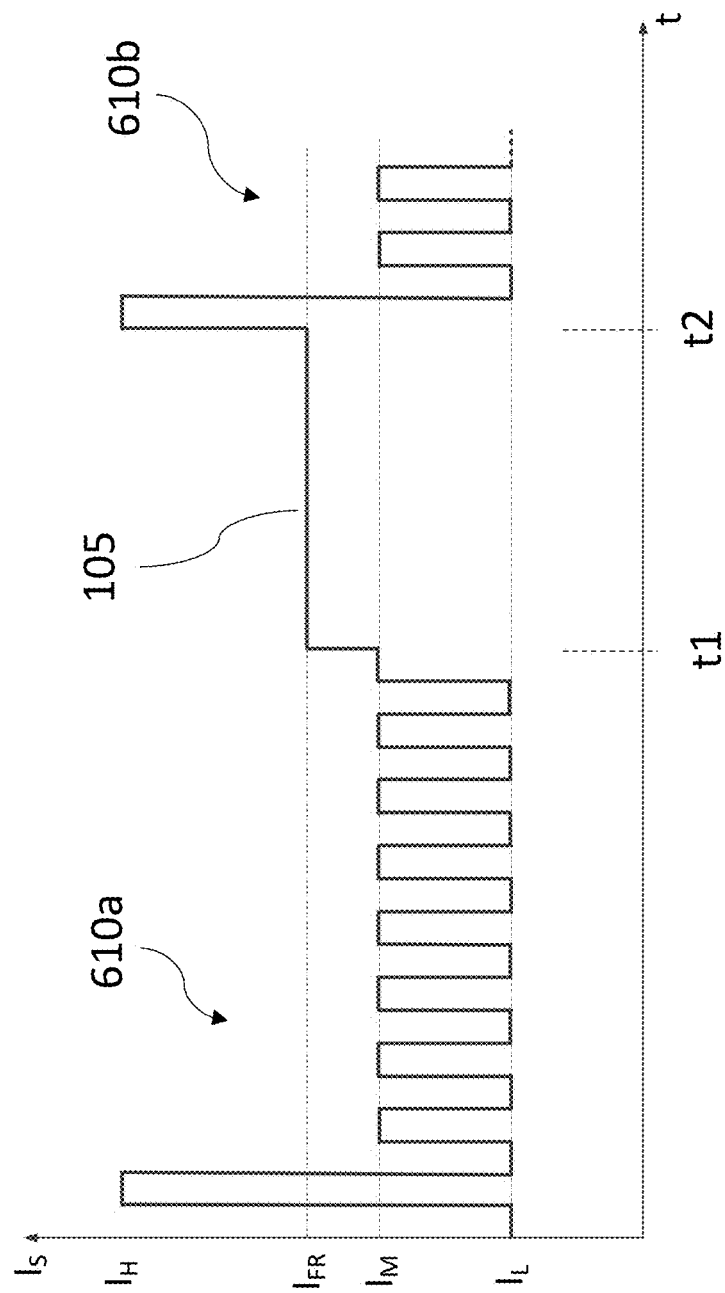

FIGS. 6*a* to 6*c* depict further embodiments with a periodic sensor signal 610*a*, *b* comprising a first part 610*a* transmitted before the first time t1 and a second part 610*b* transmitted after a second time t2. During normal operation until the first time t1 a periodic signal is transmitted. The sensor signal 610 in this embodiment uses an amplitude-modulated protocol. Therefore, in addition to the frequency information (corresponding to the speed of the wheel), further information may be transmitted by selecting different amplitude values.

In the example depicted in FIG. 6*a*, in the first portion 610*a* a first pulse 611*a* has an amplitude value extending from a low level $I_L$ to a high level $I_H$. After transmitting this high-level pulse 611*a*, low level pulses 612*a* are transmitted. The sensor signal 610 periodically fluctuates between the low level $I_L$ and an intermediate level $I_M$. Therefore, the first pulse 611*a* is higher than the low level pulses 612*a*. These pulses repeat in the second portion 610*b* of the sensor signal 610, i.e. again a first high level pulse 611*b* is followed by a sequence of low level pulses 612*b*.

In this protocol the frequency or the rotational speed of the wheel may be indicated by the frequency of the periodic pulses 611*a*, 611*b* with high level $I_H$. After each high level pulse (e.g. indicating a zero crossing of a magnetic field detected by the sensor unit), additional information may be transmitted by the low level pulses 612*a*, 612*b*. For example, a Manchester code may be used for transmitting additional data (e.g. amplitude information, error information, rotation direction).

Again, in this embodiment an error has occurred between the first time t1 and the second time t2 and in response thereto an error signal 105 is transmitted. The error signal may be transmitted after transmission of the additional data (as shown in FIG. 6*a*) or may start already before or during the transmission of the additional data. Thereafter, the malfunction may or may not be overcome, but sensor signal 610 resumes the normal signaling as described above.

In this embodiment the predetermined level $I_{FR}$ of the error signal 105 may be below the low level as shown in FIG. 6*a*. FIG. 6*b* depicts a further example, wherein the predetermined level $I_{FR}$ is between the low level $I_L$ and the intermediate level $I_M$ and FIG. 6*c* depicts an example, wherein the predetermined level $I_{FR}$ is between the intermediate level $I_M$ and the high level $I_H$. In further embodiments, the predetermined level $I_{FR}$ may even be above the high level $I_H$.

Therefore, various errors can be indicated by selecting different predetermined levels $I_{FR}$ of the constant current error signal.

The error signal 105 may also be part of a safety message indicating any malfunctioning of the sensor and may be transmitted only over a predetermined time period between the first t1 and the second time t2. It may further be possible to transmit any security relevant information from the sensor 20 to the control unit 30 so that the control unit 30 can respond to this malfunctioning. For example, the first time t1 and/or second time t2 may also be predetermined so that only the indicated (constant) level may be used to transmit the security-relevant information, without exactly identifying the moment when the malfunction has occurred.

In summary, different errors or malfunctions may be indicated by different current levels. For example, an "open" or a "short" contact could be signalized by a current of 0 mA or a maximum specified current. All other errors may be indicated by a respective level of the current signal. In further embodiments any physical quantity can be used to signalize an error, it is not necessary to have current values. However, if the rotation of the wheel is detected by using magnetic induction, the induced current may be used as a sensor signal 115 so that current signals can also be used for signaling errors. According to the present disclosure it is also possible to transmit internal errors and malfunctions of the sensor 20, which are not necessarily correlated to external errors (for example a drop of the external supply voltage). By transmitting a constant current value, the control unit 30 will receive information indicating the occurrence of an error and may react thereto. Embodiments may relate to protocols without transmitting alive signals (see FIGS. 3a to 3c and 4a to 4c), but also to protocols transmitting alive signals (see whereas FIGS. 5 and 6).

By signaling the internal errors reliably (also the type), a so-called safety mechanism may detect the malfunction and react thereto. For example, the third constant current signal may comprise a current strength, which is different from the periodic current strength, which is used to signal the rotation of a wheel. For example, the current signal may comprise a current level between 1 mA and 6 mA or substantially 3.5 mA or 2 mA or 4 mA (or between 8 mA and 13 mA or substantially 8 mA or 10.5 mA or 12 mA). Since the third current level may be different from the upper and lower level, it becomes possible to clearly detect a malfunction by identifying the third current signal, which is sufficiently different from the upper and lower level. For example, if the upper level is 14 mA and the lower level is 7 mA, the third current level may be ±20% of the 7 or 14 mA.

In further embodiments the sensor signal is a periodic signal fluctuating between an upper level and a lower level. The upper level is substantially 14 mA and the lower level is substantially 7 mA. The physical quantity may be a current signal or a voltage signal or any other electric signal suitable for transmitting information to the control unit 30.

Further examples relate to a method for providing error signals for a control unit 30.

Figure 7:
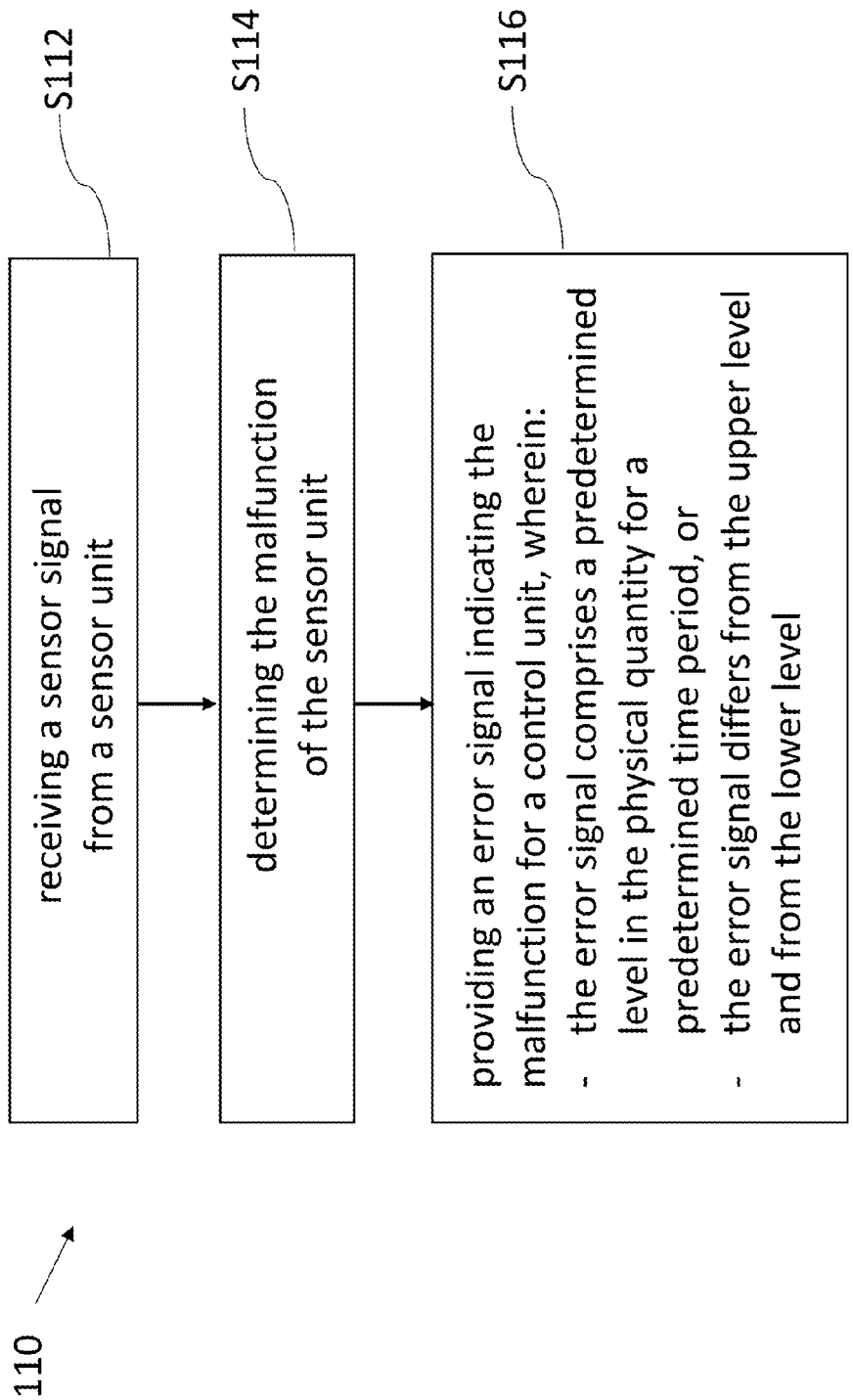
FIG. 7 depicts flow diagram of a method for providing an error signal according to embodiments of the present disclosure.

FIG. 7 depicts a flow diagram related to a method according to an embodiment. The method 110 comprises: receiving S112 a sensor signal from a sensor unit, the sensor signal being a periodic signal between an upper level and a lower level of a physical quantity; determining S114 the malfunction of the sensor unit; and providing S116 an error signal indicating the malfunction for a control unit. The error signal comprises a predetermined level of the physical quantity which differs from the upper level and from the lower level.

More details and aspects are mentioned in connection with embodiments described above or below. The method may comprise one or more optional additional acts corresponding to one or more aspects mentioned in connection with the proposed concept or one or more embodiments described above or below.

Embodiments may further provide a computer program having a program code for performing one of the above methods, when the computer program is executed on a computer or processor. A person of skill in the art would readily recognize that steps of various above-described methods might be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

For example, some embodiments relate to a unique sensor response transmitted to the control unit 30 in case a malfunction or failure within the wheel movement sensors. Such malfunctions or failure may further be related to an input signal which is too small, a magnetic offset is too high, an internal digital/analog supply voltage is below a predetermined threshold, the temperature is too high or too low or an error occurs in an analog/digital converter.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. An apparatus for providing an error signal for a control unit, the error signal indicating an internal malfunction of a sensor unit, the apparatus comprising:
   an input module configured to receive a sensor signal from the sensor unit, the sensor signal being a periodic signal;
   a determination module configured to determine the internal malfunction of the sensor unit or the apparatus; and
   an output module configured to provide the error signal indicating the internal malfunction for the control unit, wherein the error signal comprises a predetermined level of a voltage or a current, which differs from an upper level of a voltage or a current and from a lower level of a voltage or a current used for providing periodic information of the sensor signal.

2. The apparatus of claim 1, wherein the predetermined level differs from the upper level by a first offset and from the lower level by a second offset.

3. The apparatus of claim 2, wherein the first offset is equal to the second offset and is at least 20% of the upper level or at least 20% of the lower level.

4. An apparatus for providing an error signal for a control unit, the error signal indicating a malfunction of a sensor unit, the apparatus comprising:
an input module configured to receive a sensor signal from the sensor unit, the sensor signal being a periodic signal of a physical quantity, wherein the apparatus is configure to transmit a sequence of alive signals indicating an operational state of the sensor unit; and
an output module configured to provide the error signal indicating a malfunction for the control unit, wherein the error signal comprises a predetermined level of a voltage or a current for at least a predetermined time period, wherein the output module is configured to transmit the error signal for a predetermined time period being longer than a period between two subsequent alive signals of the sequence of alive signals.

5. The apparatus according to claim 1, wherein the periodic information of the sensor signal and the error signal are provided through the same transmission line or the same transmission channel.

6. The apparatus according to claim 1, the malfunction being included in a plurality of malfunctions, wherein the determination module is configured to determine different malfunctions of the plurality of malfunctions and the output module is configured to select different predetermined levels from a plurality of levels based on the different malfunctions.

7. The apparatus according to claim 6, wherein, when referring to claim 4, the sensor signal is a periodic signal fluctuating between an upper level and a lower level, the output module being further configured to select the predetermined levels being below the lower level, or between the lower level and the upper level, or above the upper level.

8. The apparatus according to claim 1, wherein the determination module is further configured to receive and to forward the sensor signal to the output module for providing the sensor signal for the control unit.

9. The apparatus according to claim 1, wherein the determination module is configured to determine the malfunction by analyzing the sensor signal transmitted from the sensor unit.

10. The apparatus according to claim 1, wherein the determination module is configured to receive an error indication signal from the sensor unit via the input module and is configured to determine the malfunction upon receipt of the error indication signal.

11. The apparatus according to claim 1, further comprising an error indication line input, wherein the sensor unit is configured to indicate the malfunction by transmitting an error indication signal via an error indication line connectable to the error indication line input, and the determination module is configured to receive the error indication signal from the error indication line input and to determine the malfunction based on the received error indication signal.

12. The apparatus according to claim 1, with the periodic information of the sensor signal being a periodic signal fluctuating between an upper level and a lower level, wherein the upper level is substantially 14 mA and the lower level is substantially 7 mA.

13. The apparatus according to claim 1, wherein the physical quantity is a current.

14. The apparatus according to claim 1, further comprising a magnetic field sensor unit configured to generate the sensor signal indicating information on a detected magnetic field.

15. The apparatus according to claim 4, wherein the error signal indicates a sensor-unit-internal malfunction.

16. The apparatus according to claim 1, wherein the error signal is caused by an input signal, which is below a predetermined threshold, a magnetic offset, which is above a predetermined threshold, an internal digital/analog supply voltage, which is below a predetermined threshold, a temperature, which is above or below a predetermined threshold, an error occurring in an analog/digital converter, a malfunctioning of a current driver of the sensor unit or a detached bonding wire.

17. A system for detecting a speed of a wheel, the system comprising:
an apparatus according to claim 1;
a sensor unit for detecting a speed of a wheel configured to generate the sensor signal indicating information on the speed of a wheel; and
a transmission unit configured to transmit the sensor signal to the apparatus.

18. The system according to claim 17, further comprising a wheel with periodic magnetic pole structure so that a rotation of the wheel is detectable by a periodic magnetic field, wherein the periodic magnetic poles are arranged along a circumference of the wheel, the detector being configured to generate a periodic electric signal from periodic variation of the magnetic field.

19. The system according to claim 17, wherein the transmission unit is configured to encode information in the sensor signal using a protocol, the protocol using a pulse width modulation or an amplitude modulation, the information being indicating a wheel speed and at least one of the a group comprising a rotational direction of the wheel, an air gap information of the detector and further information indicating an operational state of the sensor.

20. The system according to claim 17, wherein the error signal indicates a system-internal malfunction.

* * * * *